(12) United States Patent
Le Mercier et al.

(10) Patent No.: US 10,916,782 B2
(45) Date of Patent: Feb. 9, 2021

(54) SOLID-LIQUID ELECTROLYTE FOR USE IN A BATTERY

(71) Applicant: RHODIA OPERATIONS, Paris (FR)

(72) Inventors: Thierry Le Mercier, Rosny-sous-Bois (FR); Marc-David Braida, Bry-sur-Marne (FR); Robin Amisse, Paris (FR); Jules Valente, Paris (FR)

( * ) Notice: Subject to any disclaimer, the term of this patent is extended or adjusted under 35 U.S.C. 154(b) by 0 days.

(21) Appl. No.: 16/329,358

(22) PCT Filed: Aug. 24, 2017

(86) PCT No.: PCT/EP2017/071319
§ 371 (c)(1),
(2) Date: Feb. 28, 2019

(87) PCT Pub. No.: WO2018/041709
PCT Pub. Date: Mar. 8, 2018

(65) Prior Publication Data
US 2019/0221859 A1 Jul. 18, 2019

(30) Foreign Application Priority Data

Aug. 30, 2016 (EP) .................................... 16306092

(51) Int. Cl.
*H01M 6/16* (2006.01)
*H01G 11/06* (2013.01)
(Continued)

(52) U.S. Cl.
CPC .......... *H01M 6/164* (2013.01); *G02F 1/1525* (2013.01); *H01G 9/2009* (2013.01); *H01G 11/06* (2013.01);
(Continued)

(58) Field of Classification Search
None
See application file for complete search history.

(56) References Cited

U.S. PATENT DOCUMENTS 5,547,502 A 8/1996 Chevallier
5,876,494 A 2/1999 Chevallier
(Continued)

FOREIGN PATENT DOCUMENTS

CN 104585533 A 5/2015
EP 396450 A1 11/1990
(Continued)

OTHER PUBLICATIONS

Phys. Chem. Chem. Phys., 2013, 15, 18318-18335.
(Continued)

*Primary Examiner* — Christopher P Domone
(74) *Attorney, Agent, or Firm* — Osha Bergman Watanabe & Burton LLP (57) ABSTRACT

The present invention provides a solid-liquid electrolyte in the form of a gel which comprises an organic carbonate-based solvent, precipitated silica, at least one ionically conducting salt and optionally additives. The invention also relates to batteries containing said solid-liquid electrolyte. The solid-liquid electrolyte according to the present invention can improve the electrochemical properties of batteries and prevent electrolyte leakage thus reducing the risk of corrosion of the batteries.

20 Claims, 9 Drawing Sheets

(51) Int. Cl.
*H01L 51/44* (2006.01)
*H01M 10/0525* (2010.01)
*H01M 6/22* (2006.01)
*G02F 1/1523* (2019.01)
*H01G 9/20* (2006.01)
*H01M 10/0568* (2010.01)
*H01M 10/0569* (2010.01)
*H01G 11/56* (2013.01)
*H01G 11/60* (2013.01)
*H01M 10/052* (2010.01)
*H01L 51/42* (2006.01)
*H01M 10/056* (2010.01)
*H01G 11/54* (2013.01)

(52) U.S. Cl.
CPC ............ *H01G 11/54* (2013.01); *H01G 11/56* (2013.01); *H01G 11/60* (2013.01); *H01L 51/42* (2013.01); *H01L 51/441* (2013.01); *H01M 6/162* (2013.01); *H01M 6/166* (2013.01); *H01M 6/22* (2013.01); *H01M 10/052* (2013.01); *H01M 10/056* (2013.01); *H01M 10/0525* (2013.01); *H01M 10/0568* (2013.01); *H01M 10/0569* (2013.01); *H01G 9/2004* (2013.01); *H01M 2300/0085* (2013.01)

(56) References Cited

U.S. PATENT DOCUMENTS

| | | |
|---|---|---|
| 6,001,322 A | 12/1999 | Chevallier |
| 6,169,135 B1 | 1/2001 | Chevallier |
| 6,290,924 B1 | 9/2001 | Chevallier |
| 6,468,493 B1 | 10/2002 | Chevallier |
| 6,702,888 B2 | 3/2004 | Chevallier |
| 7,700,240 B2 | 4/2010 | Maier |
| 9,334,169 B2 | 5/2016 | Guy |
| 10,023,471 B2 | 7/2018 | Chevallier |
| 2004/0062701 A1 | 4/2004 | Chevallier |
| 2009/0155676 A1* | 6/2009 | Zhamu .................. H01M 2/166 429/129 |
| 2011/0178227 A1* | 7/2011 | Allain .................. C01B 33/193 524/554 |
| 2011/0263784 A1 | 10/2011 | Hernandez |
| 2012/0121975 A1* | 5/2012 | Rajaram .................. C03C 13/00 429/203 |

FOREIGN PATENT DOCUMENTS

| | | |
|---|---|---|
| EP | 670814 A1 | 9/1995 |
| EP | 762992 A1 | 3/1997 |
| EP | 762993 A1 | 3/1997 |
| EP | 917519 A1 | 5/1999 |
| EP | 520862 B1 | 4/2000 |
| EP | 670813 B1 | 3/2003 |
| EP | 1355856 A1 | 10/2003 |
| EP | 1505680 A2 | 2/2005 |
| EP | 1585688 A2 | 10/2005 |
| JP | 2001229966 A2 | 8/2018 |
| WO | 0003444 A1 | 1/2000 |
| WO | 2003016215 A1 | 2/2003 |
| WO | 2008000761 A1 | 1/2008 |
| WO | 2009112458 A1 | 9/2009 |
| WO | 201139934 A1 | 4/2011 |
| WO | 2011117400 A1 | 9/2011 |
| WO | 2013110659 A1 | 8/2013 |

OTHER PUBLICATIONS

Adv. Funct. Mater. 2011, 21, 3961-3966; J. Mater. Chem. A, 2013, 1, 12560-12567.

G. Eichinger et al: "Properties and potential application of silica-gelled electrolytes for lithium-ion batteries", Journal of Power Sources, vol. 68, No. 2, Oct. 1, 1997 (1997-10-81).

* cited by examiner

Reference 1

Battery A

Battery B

SOLID-LIQUID ELECTROLYTE FOR USE IN A BATTERY

This application is a U.S. national stage entry under 35 U.S.C. § 371 of International Application No. PCT/EP2017/071319 filed Aug. 24, 2017, which claims priority to European application EP16306092.4 filed on Aug. 30, 2016. The entire contents of these applications are explicitly incorporated herein by this reference.

TECHNICAL FIELD

The present invention relates to a solid-liquid electrolyte in the form of physical gel comprising a non-aqueous solvent, silica, at least one ionically conducting salt and additives, which can be used in primary or secondary batteries, in supercapacitors, in electro-chromic displays or in solar cells.

BACKGROUND ART

Liquid electrolytes are applied in most commercial batteries. They comprise at least one ionically conducting salt and a non-aqueous solvent.

Liquid electrolytes are characterized by a high ionic conductivity and good wetting of the electrode surface. Liquid electrolytes may have the drawback that leakage can occur.

Alternatively, solid electrolytes such as dry polymer electrolytes and polymer gel electrolytes can be used. Generally solid electrolytes are not subject to leakage, or only limited leakage occurs. However, they do not result in good wetting of the electrodes and are characterized by reduced conductivity.

The risk of electrolyte leakage cannot be completely avoided in batteries with liquid electrolyte, whereas the use of a solid electrolyte (i.e. dry polymer or gel polymer electrolyte) requires drastic changes in the battery design and manufacture. Also, the current solid electrolytes provide poor electrochemical performances due to slow kinetics and interface issues, e.g. chemical stability against the electrodes, or poor electrical contact.

Another class of electrolytes for batteries is represented by the so called "soggy-sand" electrolytes.

"Soggy-sand" electrolytes are defined as solid-liquid composite electrolytes comprising fine oxide particles, such as $Al_2O_3$, $TiO_2$, $SiO_2$, dispersed in a non-aqueous liquid electrolyte salt solution. At certain regimes of volume fractions of the oxide, which is typical to the components of the electrolytic system, the liquid electrolyte transforms into a gel electrolyte.

The risk of electrolyte leakage is greatly reduced by the use of "soggy-sand" electrolytes, which have better mechanical properties than liquid electrolytes.

Moreover, "soggy-sand" electrolytes may exhibit ion transport and ionic conductivity higher than the starting liquid electrolytes and also higher than solid electrolytes.

The conductivity of "soggy-sand" electrolytes is attributable to the formation of a percolated tight network, which depends on the amount, surface chemistry and size of the oxide present in the electrolyte.

The proportion of oxide particles in "soggy-sand" electrolytes of the prior art is defined as a critical aspect, since it determines the network formation, which leads to percolation in ionic conductivity and to acceptable ion transference number.

In this regard, Phys. Chem. Chem. Phys., 2013, 15, 18318-18335 summarizes many "soggy-sand" systems known in the art, formed by different combinations of ionically conducting salts, solvents and silica nanoparticles (fumed silica, mesostructured silica or alkyl-functionalized silica). Systems including amounts of different silica nanoparticles ranging from 0.1 vol % and 8 vol % are disclosed to form a particle network leading to percolation in ionic conductivity. The use of higher proportions of silica nanoparticles in the electrolytes is discouraged as it may lead to severe drop in conductivity.

On the other hand, U.S. Pat. No. 7,700,240, also published as EP1505680A2, discloses a non-aqueous electrolyte comprising an ionically conducting salt, a non-aqueous, anhydrous solvent and an oxide, such as $SiO_2$, having the average particle size lower than 5 μm, the oxide being present in the electrolyte in an amount from 20 to 50 vol % (that is, above 44% by weight for $SiO_2$).

Phys. Chem. Chem. Phys., 2013, 15, 18318-18335 suggests that high $Li^+$ transference number and conductivity could be achieved in a composite material consisting of up to 60 vol % of mesoporous silica. However, no experimental data confirming the above are provided.

In principle, denser electrolytes with high oxide proportion would lead to quicker and more stable network formation. However, "soggy-sand" electrolytes of the prior art are unlikely to form a particle network which is stable over time. In particular, if the volume concentration of silica particles is too large, coarsening and sedimentation may occur leading to interruption of pathways within the network, which leads to a conductivity decrease (Adv. Funct. Mater. 2011, 21, 3961-3966; J. Mater. Chem. A, 2013, 1, 12560-12567).

The need is felt for electrolytes which prevent leakage issues and at the same time, provide stable cation transference number and global conductivity over time when used in batteries, in supercapacitors, in electro-chromic displays or in solar cells.

SUMMARY OF INVENTION

It has been surprisingly discovered that the addition of precipitated silica to a liquid electrolyte results in a gel which is stable over time, without the coarsening effect that is encountered when other types of silica are used.

The present invention thus provides an improved solid-liquid electrolyte with increased stability which can be conveniently used in the preparation of primary or secondary batteries, in a supercapacitor, in an electro-chromic display or in a solar cell, having increased cation transference number and global conductivity. The solid-liquid electrolytes of the present invention provide further advantages, like forming stable particle networks inside the electrolyte, avoiding the risk for coarsening or sedimentation effects.

DESCRIPTION OF EMBODIMENTS

One object of the present invention is a solid-liquid electrolyte in the form of a gel comprising:
at least one ionically conducting salt,
at least one organic carbonate-based solvent, and
precipitated silica.

Suitable ionically conducting salts are selected from the group consisting of:
(a) MeI, Me(PF$_6$), Me(BF$_4$), Me(ClO$_4$), Me-bis(oxalato) borate ("Me(BOB)"), MeCF$_3$SO$_3$, Me[N(CF$_3$SO$_2$)$_2$], Me[N(C$_2$F$_5$SO$_2$)$_2$], Me[N(CF$_3$SO$_2$)(RFSO$_2$)], wherein R$_F$ is C$_2$F$_5$, C$_4$F$_9$ or CF$_3$OCF$_2$CF$_2$, Me(AsF$_6$), Me[C(CF$_3$SO$_2$)$_3$], Me$_2$S, Me being Li or Na,
(b)

wherein R'$_F$ is selected from the group consisting of F, CF$_3$, CHF$_2$, CH$_2$F, C$_2$HF$_4$, C$_2$H$_2$F$_3$, C$_2$H$_3$F$_2$, C$_2$F$_5$, C$_3$F$_7$, C$_3$H$_2$F$_5$, C$_3$H$_4$F$_3$, C$_4$F$_9$, C$_4$H$_2$F$_7$, C$_4$H$_4$F$_5$, C$_5$F$_{11}$, C$_3$F$_5$OCF$_3$, C$_2$F$_4$OCF$_3$, C$_2$H$_2$F$_2$OCF$_3$ and CF$_2$OCF$_3$, and (c) mixtures thereof.

When the solid-liquid electrolytes hereby concerned are those suitable for lithium-ion cells, the at least one ionically conducting salt is preferably selected from the group consisting of LiPF$_6$, LiBF$_4$, LiClO$_4$, lithium bis(oxalato)borate ("LiBOB"), LiN(CF$_3$SO$_2$)$_2$, LiN(C$_2$F$_5$SO$_2$)$_2$, Li[N(CF$_3$SO$_2$)(RFSO$_2$)]n with R$_F$ being C$_2$F$_5$, C$_4$F$_9$, CF$_3$OCF$_2$CF$_2$, LiAsF$_6$, LiC(CF$_3$SO$_2$)$_3$ and mixtures thereof. More preferably, the ionically conducting salt is LiPF$_6$.

The ionically conducting salt is preferably dissolved in the organic carbonate-based solvent in a concentration between 0.5 and 1.5 molar, more preferably between 0.8 and 1.2 molar, still more preferably of 1 molar.

Non-limiting examples of suitable organic carbonate-based solvents include unsaturated cyclic carbonates and unsaturated acyclic carbonates.

Preferred unsaturated cyclic carbonates include cyclic alkylene carbonates, e.g. ethylene carbonate (EC), propylene carbonate (PC), butylene carbonate, fluoroethylene carbonate and fluoropropylene carbonate. A more preferred unsaturated cyclic carbonate is ethylene carbonate.

Preferred unsaturated acyclic carbonates include dimethylcarbonate (DMC), diethylcarbonate (DEC), ethylmethylcarbonate (EMC), dimethylethane (DME). A preferred unsaturated acyclic carbonate is dimethyl carbonate.

In a preferred embodiment, the at least one organic carbonate-based solvent is a mixture of at least one unsaturated acyclic carbonate and at least one unsaturated cyclic carbonate. More preferably, the at least one organic carbonate-based solvent is a mixture of EC and DMC.

Preferably, the mixture of at least one unsaturated acyclic carbonate and at least one unsaturated cyclic carbonate comprises the at least one unsaturated cyclic carbonate and the at least one unsaturated acyclic carbonate in a ratio from 1:3 to 1:1 by volume, more preferably of from 1:1.5 to 1:1 by volume, still more preferably of 1:1 by volume.

An advantageous combination of ionically conducting salt and organic carbonate-based solvent may for instance be a 1 molar solution of LiPF$_6$ in EC:DMC 1:1 by volume.

The solid-liquid electrolyte in the form of a gel of the present invention comprises precipitated silica.

By "precipitated silica" it is meant a silica that is typically prepared by precipitation from a solution containing silicate salts (such as sodium silicate), with an acidifying agent (such as sulphuric acid).

Precipitated silica may be obtained in the form of granules (with a size of at least 1 mm, for example of between 1 and 10 mm), micropearls (with a typical mean size of between 100 and 300 μm) or powder.

Precipitated silica used in the invention may be prepared by implementing the methods described in EP396450A, EP520862A, EP670813A, EP670814A, EP762992A, EP762993A, EP917519A, EP1355856A, WO03/016215, WO2009/112458, WO2011/117400, WO2013/110659, WO2013/139934, WO2008/000761.

Notable, non-limiting examples of precipitated silica which could be used in the present invention are for instance Tixosil® 43, Tixosil® 68B, Tixosil® 331 or Tixosil® 365, all commercially available from Solvay.

The precipitated silica used in the solid-liquid electrolyte of the present invention is conveniently in particulate form.

Silica in such a form may be obtained by means of a milling or micronizing step performed on the dried silica.

The term "particulate form" means solid particles of median particle size comprised in the range of from 3.0 μm to 80.0 μm. The median particle size is typically determined by laser diffraction.

In a preferred embodiment, the precipitated silica median particle size is comprised in the range of from 3.0 to 80.0 μm, more preferably of from 3.0 to 60.0 μm, still more preferably from 3.0 to 20.0 μm. In some embodiments, the median particle size may be greater than 5.0 μm, even greater than 6.0 μm.

The median particle size may be determined by laser diffraction using a MALVERN (MasterSizer 2000) particle sizer, employing the Fraunhofer theory. The analysis protocol includes a first full deagglomeration of the precipitated silica sample to be carried out before the laser diffraction determination.

The full deagglomeration of the precipitated silica sample is carried out directly in the sample dispersion unit of the MasterSizer 2000 by setting the following parameters, until median particle size variation between two consecutive analyses is inferior to 5%:
Hydro 2000G sample dispersion unit
Stirring conditions: 500 rpm
Pump conditions: 1250 rpm
Ultrasonic probe: 100%
Measurement parameters:
Obscuration range: 8-15%
Background measurement duration: 10 s
Measurement duration: 10 s Delay between measurements: 1 s.

Time to reach a stable median particle size with such protocol is typically around one hundred seconds.

The precipitated silica used in the solid-liquid electrolyte of the present invention is characterized by a BET specific surface area of from 100 to 650 m$^2$/g.

In one preferred embodiment of the present invention the precipitated silica has a BET specific surface area of from 100 to 270 m$^2$/g. The precipitated silica typically has a BET specific surface of at least 110 m$^2$/g, in particular of at least 120 m$^2$/g. The BET specific surface generally is at most 240 m$^2$/g, in particular at most 250 m$^2$/g.

In another preferred embodiment, the precipitated silica has a BET specific surface area of from 300 to 650 m$^2$/g. The precipitated silica typically has a BET specific surface of at least 310 m$^2$/g, in particular of at least 330 m$^2$/g.

The BET specific surface is determined according to the Brunauer-Emmett-Teller method described in The Journal of the American Chemical Society, Vol. 60, page 309, February 1938, and corresponding to the standard NF ISO 5794-1, Appendix E (June 2010).

Suitable precipitated silicas may for example have:
  a BET specific surface of from 100 to 270 m$^2$/g, and a median particle size of from 3.0 to 80.0 µm, or
  a BET specific surface of from 300 to 650 m$^2$/g, and a median particle size of from 3.0 to 80.0 µm.

Preferred precipitated silicas used in the solid-liquid electrolyte of the present invention are characterized by having a Bound Water Content of at least 2.5 wt %, more preferably of at least 4.0 wt %.

The Bound Water Content is determined by the difference between the Loss on Ignition at 1000° C. (measured according to DIN 55921, ISO 3262/11, ASTM D 1208) and the Moisture Loss measured at 105° C. (measured according to ISO 787/2, ASTM D 280); this value is characteristic of the underlying structure of the silica.

The precipitated silica used in the present invention preferably exhibits a pH of between 6.3 and 8.0, more preferably of between 6.3 and 7.6.

The pH is measured according to a modification of standard ISO 787/9 (pH of a 5% suspension in water) as follows: 5 grams of precipitated silica are weighed to within about 0.01 gram into a 200 ml beaker. 95 ml of water, measured from a graduated measuring cylinder, are subsequently added to the precipitated silica powder. The suspension thus obtained is vigorously stirred (magnetic stirring) for 10 minutes. The pH measurement is then carried out.

According to a particular embodiment, the precipitated silica used in the present invention comprises aluminium. The aluminium content is typically at most 3% by weight, generally between 0.5 and 2.5% by weight with respect to the weight of the precipitated silica.

The quantity of aluminium may be measured by any suitable method, for example ICP-AES ("Inductively Coupled Plasma—Atomic Emission Spectroscopy") after the addition of the silica in water in the presence of hydrofluoric acid.

In general, the precipitated silica has a CTAB specific surface of between 100 and 625 m$^2$/g. The CTAB specific surface is the external surface, which can be determined according to the standard NF ISO 5794-1, Appendix G (June 2010).

The amount of precipitated silica present in the solid-liquid electrolyte of the present invention is such as to give the electrolyte a consistency of a gel.

With the term "gel" it is intended to denote a semi-rigid colloidal dispersion of a solid with a liquid to produce a viscous jelly-like product.

Preferably, the amount by weight of precipitated silica in the solid-liquid electrolyte of the present invention is comprised in the range from 1.0% to 25.0% relative to the total weight of the solid-liquid electrolyte.

According to a first variant of the invention, the solid-liquid electrolyte in the form of a gel comprises:
  at least one ionically conducting salt,
  at least one organic carbonate-based solvent, and
  precipitated silica in an amount by weight comprised in the range of from 8.0% to 25.0% relative to the total weight of the electrolyte. The amount by weight of precipitated silica may be advantageously from 8.5% to 25.0% relative to the total weight of the electrolyte, preferably from 9.0% to 25.0%, and even from 10.0% to 25.0%.

In one embodiment of the present invention the precipitated silica is in an amount by weight of from 8.5% to 15.0%, from 9.0% to 15.0%, even 10.0% to 15.0%, relative to the total weight of the electrolyte.

In one preferred embodiment, the present invention provides a solid-liquid electrolyte in the form of a gel which comprises:
  at least one ionically conducting salt,
  at least one organic carbonate-based solvent, and
  precipitated silica in an amount by weight comprised in the range of from 8.0% to 15.0%, preferably from 9.0% to 15.0%, even from 10.0% to 15.0%, relative to the total weight of the electrolyte,
wherein the precipitated silica has a BET specific surface of from 100 to 270 m$^2$/g, and a median particle size of from 3.0 to 80.0 µm. In some instances the median particle size may be greater than 5.0 µm, even greater than 6.0 µm.

In another embodiment of the present invention the precipitated silica is in an amount by weight of from 20.0% to 25.0% relative to the total weight of the electrolyte.

In a further preferred embodiment, the present invention provides a solid-liquid electrolyte in the form of a gel which comprises:
  at least one ionically conducting salt,
  at least one organic carbonate-based solvent, and
  precipitated silica in an amount by weight comprised in the range of from 20.0% to 25.0% relative to the total weight of the electrolyte,
wherein the precipitated silica has a BET specific surface of from 300 to 650 m$^2$/g, and a median particle size of from 3.0 to 80.0 µm. In some instances the median particle size may be greater than 5.0 µm, even greater than 6.0 µm.

It has been discovered that when the precipitated silica is present in an amount by weight comprised between 8.0% and 25.0% relative to the total weight of the electrolyte, the solid-liquid electrolyte is characterized by high mechanical properties, so that easy spreading and stable gels are obtained. Said stable gels are thick enough to be extruded, leading to clear advantages when used in the production of batteries.

The solid-liquid electrolyte according to this first variant is thick enough to be suitable as self-standing electrolyte that can be used in the preparation of separator-free lithium or sodium-ion batteries, as well as in the preparation of conventional lithium or sodium-ion batteries.

According to a second variant, the present invention provides a solid-liquid electrolyte in the form of a gel comprising:
  at least one ionically conducting salt, at least one organic carbonate-based solvent, and
precipitated silica in an amount by weight of from 1.0% to 8.0% relative to the total weight of the electrolyte.

The presence of the precipitated silica in the solid-liquid electrolyte according to said second variant favors the retention of the liquid electrolyte, while, at the same time, results in a sufficiently low viscosity solid-liquid electrolyte which makes it suitable for use in the production of conventional lithium or sodium batteries. The batteries making use of the solid-liquid electrolyte according to this said second variant show superior cycle performances, in particular at high discharge rates, in comparison with batteries including a liquid electrolyte.

In a further preferred embodiment, the present invention provides a solid-liquid electrolyte in the form of a gel which comprises:
at least one ionically conducting salt,
at least one organic carbonate-based solvent, and
precipitated silica in an amount by weight comprised in the range of from of 1.0% to 8.0% relative to the total weight of the electrolyte, wherein the precipitated silica has a BET specific surface of from 100 to 270 m$^2$/g, and a median particle size of from 3.0 to 80.0 μm. In some instances the median particle size may be greater than 5.0 μm, even greater than 6.0 μm.

The solid-liquid electrolyte of the present invention can also conveniently contain at least one additive selected from the group consisting of:
film forming carbonates, such as vinylene carbonate (VC), vinyl ethylene carbonate (VEC), fluoroethylene carbonate (FEC), allyl ethyl carbonate,
conductive coatings, such as Poly-thiophene, poly(3,4-ethylenedioxythiophene (PEDOT),
additional lithium salts, such as Li bis(trifluorosulphonyl) imide, lithium oxalyldifluoroborate,
catalyst inhibitors, such as $SO_2$, $CS_2$, cyclic alkyl sulfites,
Solid Electrolyte Interphase (SEI) stabilizers, such as $B_2O_3$, organic borates, boroxines,
surfactants, such as perfluoro-octyl-ethylene carbonate (PFO-EC),
passivizing agents, such as hexafluoroisopropanol, succinic anhydride,
ionic liquids,
redox shuttles, and
fire retardants.

In another object, the present invention provides an electronic device, in particular primary or secondary batteries, supercapacitors, electro-chromic displays or solar cells comprising the solid-liquid electrolyte as defined above.

In a preferred aspect, the present invention concerns lithium or sodium ion primary or secondary batteries, preferably lithium-ion batteries, comprising positive electrode containing an electroactive compound EA1, a negative electrode containing an electroactive compound EA2 and a solid-liquid electrolyte in the form of a gel comprising:
at least one ionically conducting lithium or sodium salt,
at least one organic carbonate-based solvent, and
precipitated silica.

In the case of forming a positive electrode for a lithium-ion secondary battery, the compound EA1 may comprise a composite metal chalcogenide of formula $LiMQ_2$, wherein M is at least one metal selected from transition metals such as Co, Ni, Fe, Mn, Cr and V and Q is a chalcogen such as O or S. Among these, it is preferred to use a lithium-based composite metal oxide of formula $LiMO_2$, wherein M is the same as defined above. Preferred examples thereof may include $LiCoO_2$, $LiNiO_2$, $LiNi_xCo_{1-x}O_2$ (0<x<1) and spinel-structured $LiMn_2O_4$.

As an alternative, compound EA1 may comprise a lithiated or partially lithiated transition metal oxyanion-based electro-active material of formula $M_1M_2(JO_4)_fE_{1-f}$, wherein $M_1$ is lithium, which may be partially substituted by another alkali metal representing less than 20% of the $M_1$ metals, $M_2$ is a transition metal at the oxidation level of +2 selected from Fe, Mn, Ni or mixtures thereof, which may be partially substituted by one or more additional metals at oxidation levels between +1 and +5 and representing less than 35% of the $M_2$ metals; $JO_4$ is any oxyanion wherein J is either P, S, V, Si, Nb, Mo or a combination thereof; E is a fluoride, hydroxide or chloride anion; f is the molar fraction of the $JO_4$ oxyanion, generally comprised between 0.75 and 1.

The $M_1M_2(JO_4)_fE_{1-f}$ electro-active material as defined above is preferably phosphate-based and may have an ordered or modified olivine structure.

More preferably, compound EA1 has formula $Li_{3-x}M'_yM''_{2-y}(JO_4)_3$ wherein 0≤x≤3, 0≤y≤2, M' and M'' are the same or different metals, at least one of which being a transition metal, $JO_4$ is preferably $PO_4$ which may be partially substituted with another oxyanion, wherein J is either S, V, Si, Nb, Mo or a combination thereof. Still more preferably, compound EA1 is a phosphate-based electro-active material of formula $Li(Fe_xMn_{1-x})PO_4$ wherein 0≤x≤1, wherein x is preferably 1 (that is to say, lithium iron phosphate of formula $LiFePO_4$).

In the case of forming a negative electrode for a lithium-ion secondary battery, compound EA2 may preferably comprise:
graphitic carbons able to intercalate lithium, typically existing in forms such as powders, flakes, fibers or spheres (for example, mesocarbon microbeads) hosting lithium;
lithium metal;
lithium alloy compositions, including notably those described in U.S. Pat. No. 6,203,944 and/or in WO 00/03444;
lithium titanates, generally represented by formula $Li_4Ti_5O_{12}$; these compounds are generally considered as "zero-strain" insertion materials, having low level of physical expansion upon taking up the mobile ions, i.e. $Li^+$;
lithium-silicon alloys, generally known as lithium silicides with high Li/Si ratios, in particular lithium silicides of formula $Li_{4.4}Si$;
lithium-germanium alloys, including crystalline phases of formula $Li_{4.4}Ge$ Preferred lithium ion batteries comprise a lithium-cobalt-oxide ($LiCoO_2$, or "LCO") or a lithium-nickel-manganese-cobalt-oxide (such as $LiNi_{0.33}Mn_{0.33}O_{0.33}O_2$, or "NMC") positive electrode and a graphite negative electrode.

In one embodiment the present invention refers to a conventional lithium or sodium battery comprising a solid-liquid electrolyte in the form of a gel comprising:
at least one ionically conducting salt,
at least one organic carbonate-based solvent, and
precipitated silica in an amount by weight of from 1.0% to 8.0% relative to the total weight of the electrolyte.

In another embodiment, the present invention refers to a conventional lithium or sodium battery comprising a solid-liquid electrolyte in the form of a gel comprising:
at least one ionically conducting salt,
at least one organic carbonate-based solvent, and precipitated silica in an amount by weight of from 8.0% to 25.0% relative to the total weight of the electrolyte.

All definitions and preferences provided above in respect of the solid-liquid electrolyte equally apply to the electronic devices, in particular primary and secondary batteries object of the invention.

The term "conventional lithium or sodium-ion battery" is defined to include batteries containing a non-aqueous electrolyte, a negative electrode comprising an active material which releases lithium or sodium ions when discharging and absorbs lithium or sodium ions when the battery is being charged, and a positive electrode, wherein said negative electrode being in general separated from the positive one by a porous membrane (a "separator") which provides spatial and electrical separation of the negative electrode and positive electrode.

Figure 1:
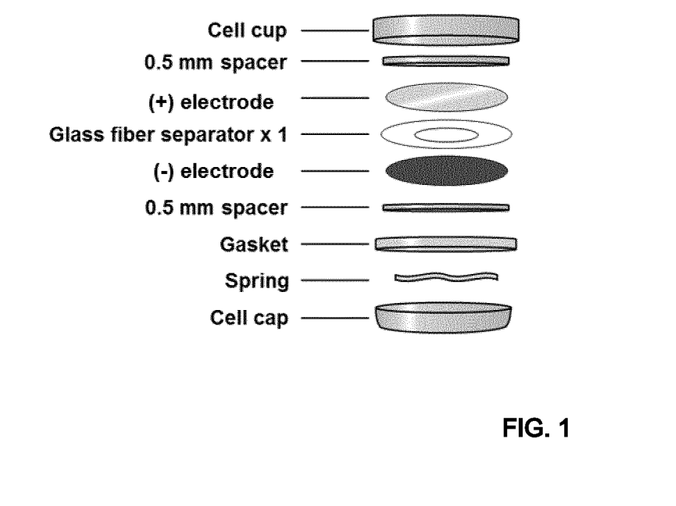
FIG. 1 shows a schematic illustration of a coin cell lithium-ion battery according to Example 1.

The schematic illustration of a conventional coin cell lithium-ion battery according to said embodiment is reported in FIG. 1.

In another embodiment the present invention refers to a separator-free lithium or sodium battery comprising a solid-liquid electrolyte in the form of a gel comprising:
at least one ionically conducting salt,
at least one organic carbonate-based solvent, and
precipitated silica in an amount by weight of from 8.0% to 25.0% relative to the total weight of the electrolyte.

The term "separator-free batteries" refers to batteries having a negative electrode comprising an active material which releases lithium or sodium ions when discharging and absorbs lithium or sodium ions when the battery is being charged, wherein a self-standing electrolyte is placed within said negative electrode and the positive electrode, without the need for a physical separator.

Figure 3:
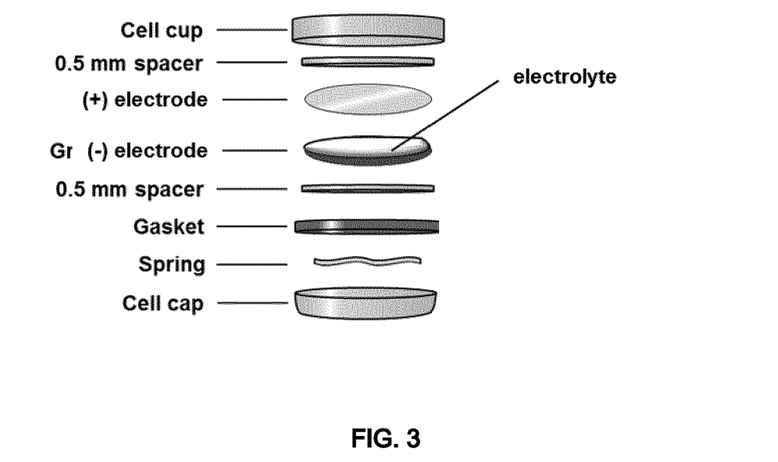
FIG. 3 shows a schematic illustration of a coin cell separator-free lithium-ion battery according to Example 3.

The schematic illustration of a coin cell separator-free battery according to said embodiment is reported in FIG. 3.

The solid-liquid electrolyte of the present invention is preferably in a form of layer applied between the positive electrode and the negative electrode of a battery.

The layer of solid-liquid electrolyte can be deposited during the assembly of a battery cell.

The consistency of the solid-liquid electrolyte of the present invention makes the deposition of the electrolyte particularly easy and safe.

It is known in the art that the performance of gel electrolytes is limited from their lack of mechanical integrity to prevent electrical shorting between the electrodes. To overcome this effect, the thickness of gel electrolytes is typically larger than that of traditional separator materials used in cells containing a liquid electrolyte. This increased electrolyte thickness results however in a lower conductivity.

The applicant has surprisingly found that the solid-liquid electrolyte according to the present invention even if applied between the positive electrode and the negative electrode of a battery in a high thickness layer allows obtaining batteries having improved cation transport properties in comparison with conventional batteries wherein the thickness of the liquid electrolyte is of about 25 µm.

The thickness of the layer of solid-liquid electrolytes according to the present invention is conveniently comprised in the range from 1 to 1000 µm, preferably from 10 to 400 µm.

In a preferred embodiment, the present invention provides a secondary lithium or sodium battery containing a solid-liquid electrolyte in the form of a gel comprising $LiPF_6$ or $NaPF_6$, a mixture of EC and DMC and precipitated silica.

Advantageously, the risk of corrosion of the elements in a lithium or sodium ion battery by HF formed during the decomposition of $LiPF_6$ or $NaPF_6$-based electrolytes is limited by the HF scavenging properties of precipitated silica.

The invention will be now described with reference to the following examples, whose purpose is merely illustrative and not intended to limit scope of the invention.

Should the disclosure of any patents, patent applications, and publications which are incorporated herein by reference conflict with the description of the present application to the extent that it may render a term unclear, the present description shall take precedence.

EXAMPLES

Raw Material

PRECIPITATED SILICA 1: $S_{BET}$=633 m²/g; median particle size 17.0 µm (measured by laser diffraction); Bound Water Content=4.2%.

PRECIPITATED SILICA 2: $S_{BET}$=147 m²/g; median particle size 3.8 µm (measured by laser diffraction); Bound Water Content=4.4%, commercially available as Tixosil® 365 from Solvay.

PRECIPITATED SILICA 3: $S_{BET}$=217 m²/g; median particle size 10.5 µm (measured by laser diffraction); Bound Water Content=4.1%, commercially available as Tixosil® 43 from Solvay.

PYROGENIC SILICA 1: pyrogenic silica having $S_{BET}$=200 m²/g; median particle size 4.3 m (measured by laser diffraction); Bound Water Content=1.0%, commercially available as Aerosil® 200v from Evonik.

LP30: 1M $LiPF_6$ in EC:DMC (1:1 vol %) 99.9% commercially available as Solvionic® E001 from Solvionic.

Example 1

A solid-liquid electrolyte comprising 21.0 wt % of PRECIPITATED SILICA 1 in LP30 with 2.0 wt % VC was prepared (Electrolyte A).

The precipitated silica was dried and added to the liquid electrolyte in an inert atmosphere, so as to avoid traces of water in the final product.

Electrolyte (A) was introduced into a coin cell lithium-ion secondary battery configured as schematized in FIG. 1 (Battery A):
negative electrode: Artificial graphite
Formulation: [SCMG-AR graphite]+[Super-P carbon]+[PVDF 8% Solef® 5130] 90:4:6 by weight (manufactured by Umicore) Electrode loading: 9.3 mg/cm², 200-202 µm thickness;
positive electrode: $LiCoO_2$ Cellcore® LCO (manufactured by Umicore)
Formulation: $LiCoO_2$+[Super-P carbon]+[PVDF 8% Solef® 5130], ratio 92:4:4 by weight
Electrode loading: 17.3 mg/cm², 175-177 µm thickness
Theoretical capacity: 161 mAh/g.

A ring-shaped glass fiber separator was used to avoid contact between the electrodes.

The separator ring was placed on the negative electrode; electrolyte (A) was applied in the form of a layer having thickness greater than 350 µm in the hole of the separator; and the positive electrode was pressed on top.

Battery A was subjected to a power test (charge-discharge cycles with increasing discharge rates) under the following conditions:
2×GCPL* charge/discharge cycle at C/20-C/20 rate
5×GCPL* charge/discharge cycle at C/10-C/10 rate
5×GCPL* charge/discharge cycle at C/5-C/5 rate 5×GCPL* charge/discharge cycle at C/2-C/2 rate
5×GCPL* charge/discharge cycle at C/2-1 C rate
5×GCPL* charge/discharge cycle at C/2-2 C rate
5×GCPL* charge/discharge cycle at C/2-5 C rate GCPL=Galvanostatic Cycling with Potential Limitation The C-rate is a measure of the rate at which a battery is being charged or discharged. It is defined as the current divided by the theoretical current draw under which the battery would deliver its nominal rated capacity in one hour.

Post-mortem observation of the cell components: no trace of liquid or gel electrolyte besides the electrodes and separator in the cell, that is, zero leakage.

Example 2

A first battery was prepared as described in example 1 (Battery A).

A solid-liquid electrolyte comprising 11.9 wt % of PRECIPITATED SILICA 2 in LP30 with 2.0 wt % VC was prepared (Electrolyte B).

The precipitated silica was dried and added to the liquid electrolyte in an inert atmosphere, so as to avoid traces of water in the final product.

Electrolyte B was introduced into a coin cell lithium-ion secondary battery configured as schematized in FIG. 1 (Battery B). The thickness of the layer of Electrolyte B was greater than 350 μm.

Figure 2:
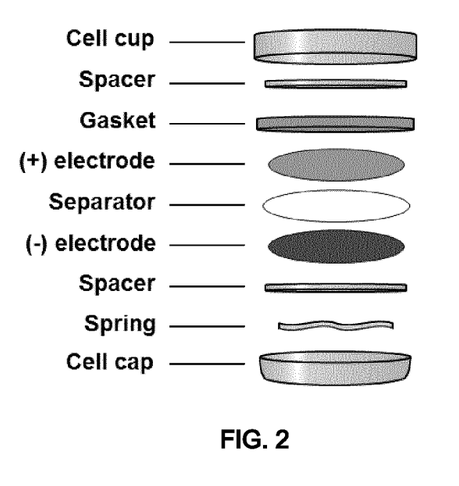
FIG. 2 shows a schematic illustration of a reference of Example 2.

A reference coin cell lithium-ion battery configured as schematized in FIG. 2, that is, having the same configuration as the battery of Example 1 but including a Celgard®-PP-PE-PP-tri-layer separator instead of a ring-shaped glass fiber separator, was prepared, said battery including the liquid electrolyte comprising LP30 with 2.0 wt % VC (Reference 1). The thickness of the layer of liquid electrolyte in the Reference 1 battery was 25 μm.

Battery A, Battery B and Reference 1 battery were subjected to the same power test with the same protocol shown in Example 1.

Figure 4:
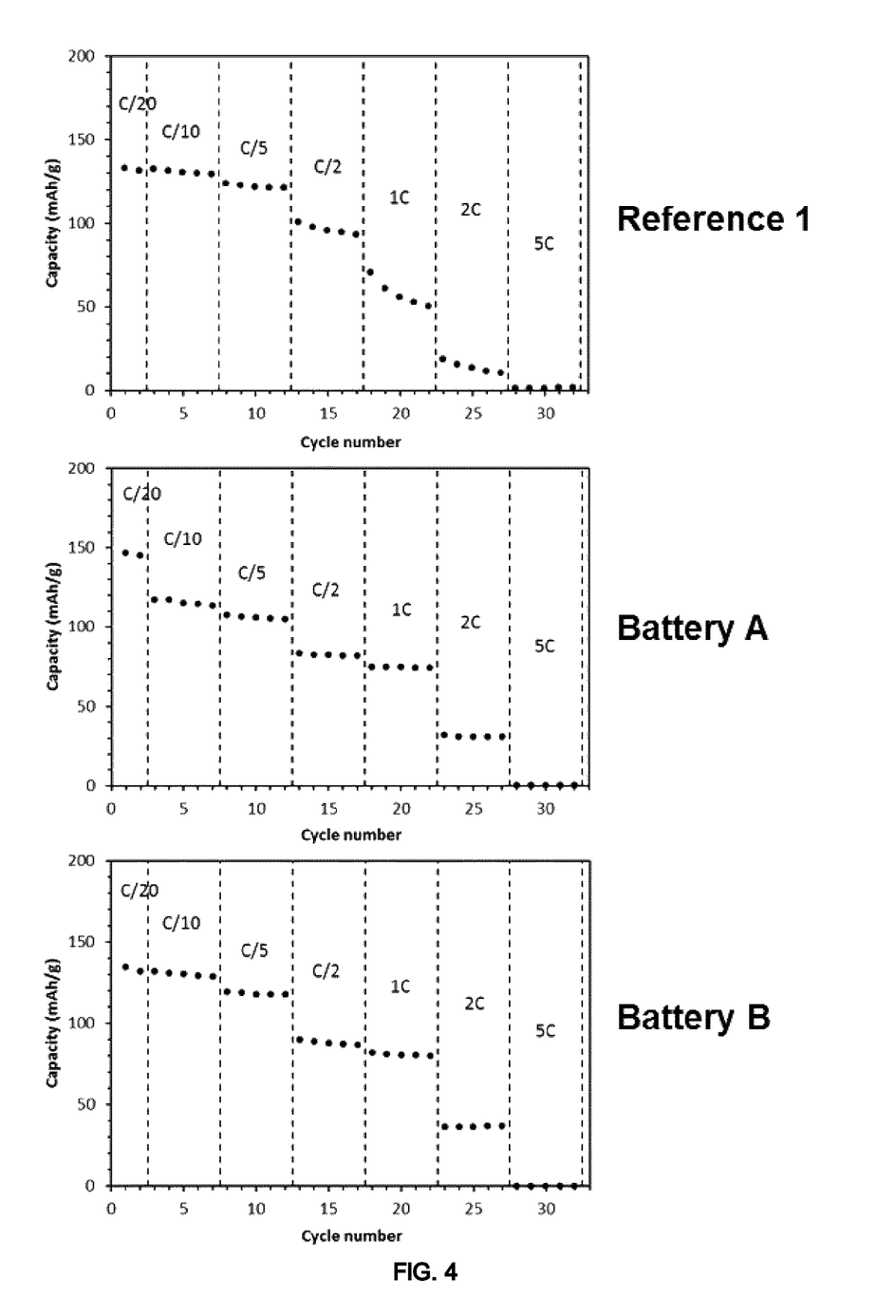
FIG. 4 illustrates graphs showing the results of electrochemical test (capacity vs cycle number with the different discharge rates) of the coin cells of Example 2.

The results reveals superior performances at high C-rate (1 C and 2 C) of the batteries according to the present invention ((Battery A) and (Battery B)) in comparison with the Reference 1 (FIG. 4).

Example 3

A solid-liquid electrolyte comprising 11.6 wt % of PRECIPITATED SILICA 3 in LP30 with 2.0 wt % VC was prepared (Electrolyte C).

The precipitated silica was dried and added to the liquid electrolyte in an inert atmosphere, so as to avoid traces of water in the final product.

Electrolyte (C) was introduced into a coin cell separator-free lithium-ion secondary battery configured as schematized in FIG. 3 (Battery C):
negative electrode: Artificial graphite
    Formulation: [SCMG-AR graphite]+[Super-P carbon]+[PVDF 8% Solef® 5130] 90:4:6 by weight (manufactured by Umicore)
    Electrode loading: 9.3 mg/cm$^2$, 200-202 μm thickness;
positive electrode: LiCoO$_2$ Cellcore® LCO (manufactured by Umicore)
    Formulation: LiCoO$_2$+[Super-P carbon]+[PVDF 8% Solef® 5130], ratio 92:4:4 by weight
    Electrode loading: 17.3 mg/cm$^2$, 175-177 μm thickness
    Theoretical capacity: 161 mAh/g.

A drop of solid-liquid electrolyte was deposited on the negative electrode and the positive electrode was pressed on top.

A reference battery (Reference 2) having the same configuration of Battery C but including a solid-liquid electrolyte comprising 11.4 wt % of PYROGENIC SILICA 1 in LP30 with 2.0 wt % VC was prepared.

Battery C and Reference 2 battery were subjected to power test with the same protocol shown in Example 2 (charge-discharge cycles with increasing discharge rates).

Figure 5:
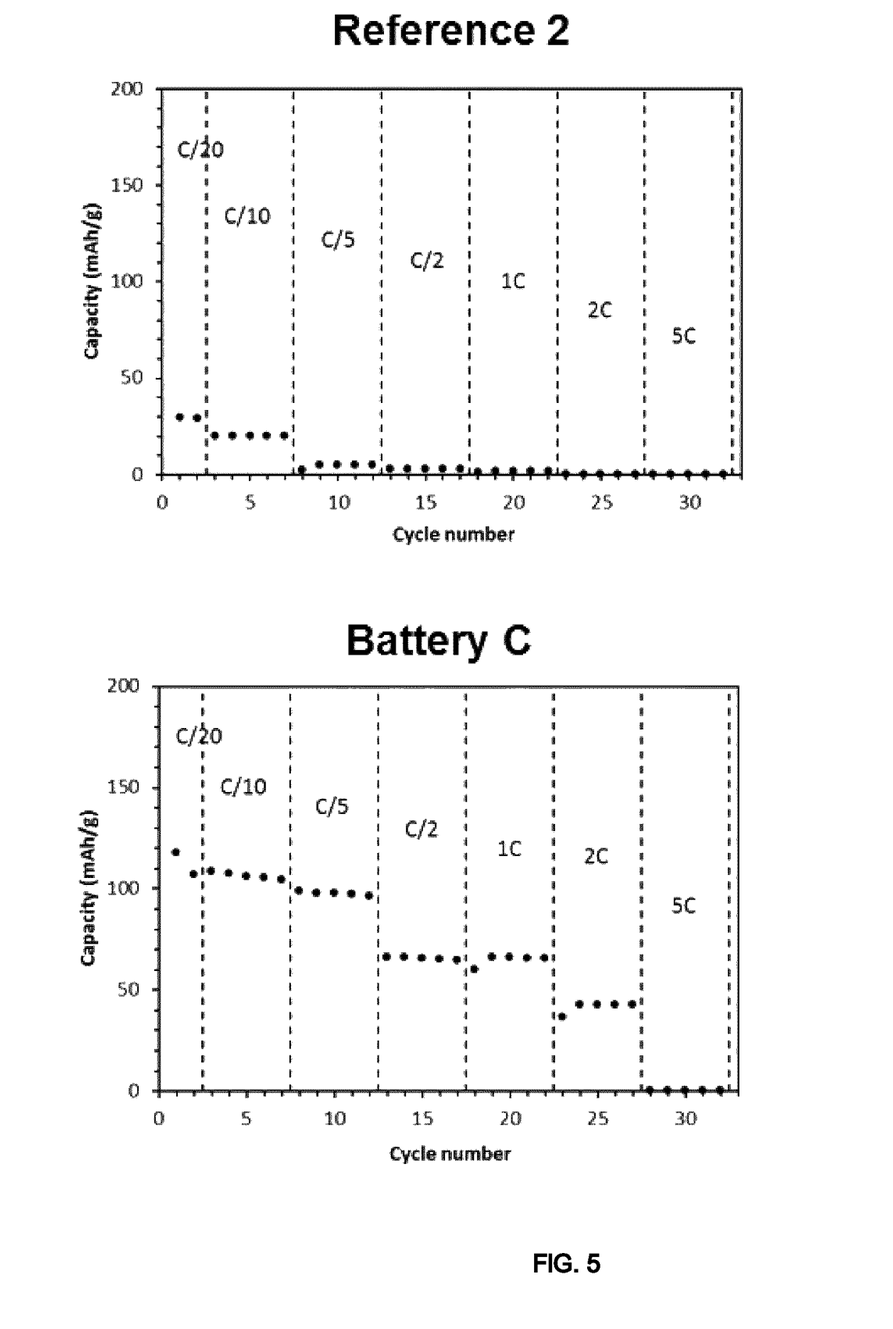
FIG. 5 illustrates graphs showing the results of electrochemical test (capacity vs cycle number with the different discharge rates) of the coin cells of Example 3.

The results show the higher performances of the battery according to the present invention (Battery C) in comparison with the Reference 2 battery, which died after 8 cycles (FIG. 5).

Moreover, the electrolyte used in the Reference 2 battery showed a very short stability in the form of a gel, leading to coarsening of the electrolyte including the pyrogenic silica as soon as extrusion was started: it was impossible to extrude it, showing exit of liquid first, and then the crumbles of solid silica.

Example 4

A solid-liquid electrolyte comprising 1.8 wt % of PRECIPITATED SILICA 2 in in LP30 with 2.0 wt % VC was prepared (Electrolyte D).

The precipitated silica was dried and added to the liquid electrolyte in an inert atmosphere, so as to avoid traces of water in the final product.

Electrolyte (D) was introduced into a coin cell lithium-ion secondary battery configured as schematized in FIG. 1 (Battery D):
negative electrode: graphite
    [SMG-A graphite (Hitachi, Japan)]+[Super C65 carbon]+PVDF Solef® 5130, ratio 90:5:5 by weight;
    Electrode loading: 10 mg/cm$^2$, 70 μm thickness;
positive electrode: NMC
    Formulation: LiNi$_{0.33}$Mn$_{0.33}$Co$_{0.33}$O$_2$+[Super C65 carbon]+[KS6L graphite]+PVDF Solef® 5130, ratio 90:3:4:3 by weight;
    Electrode loading: 17 mg/cm$^2$, 70 μm thickness;
    Theoretical capacity: 148 mAh/g.

The separator ring was placed on the negative electrode; electrolyte (D) was applied in the form of a layer having thickness greater than 350 μm in the hole of the separator; and the positive electrode was pressed on top.

A reference coin cell lithium-ion battery having the same configuration as Battery D but including a Celgard separator instead of a ring-shaped glass fiber separator, was prepared, said battery including as liquid electrolyte the mixture comprising LP30+2 wt. % VC (Reference 3). The thickness of the layer of liquid electrolyte in the Reference 3 battery was 25 μm.

Battery D and Reference 3 battery were subjected to a power test (charge-discharge cycles with increasing discharge rates) under the following conditions:
    5×GCPL charge/discharge cycle at C/10-C/10 rate
    5×GCPL charge/discharge cycle at C/5-C/5 rate
    5×GCPL charge/discharge cycle at C/2-C/2 rate
    5×GCPL charge/discharge cycle at C/2-1 C rate
    5×GCPL charge/discharge cycle at C/2-2 C rate
    5×GCPL charge/discharge cycle at C/2-5 C rate.

Figure 6:
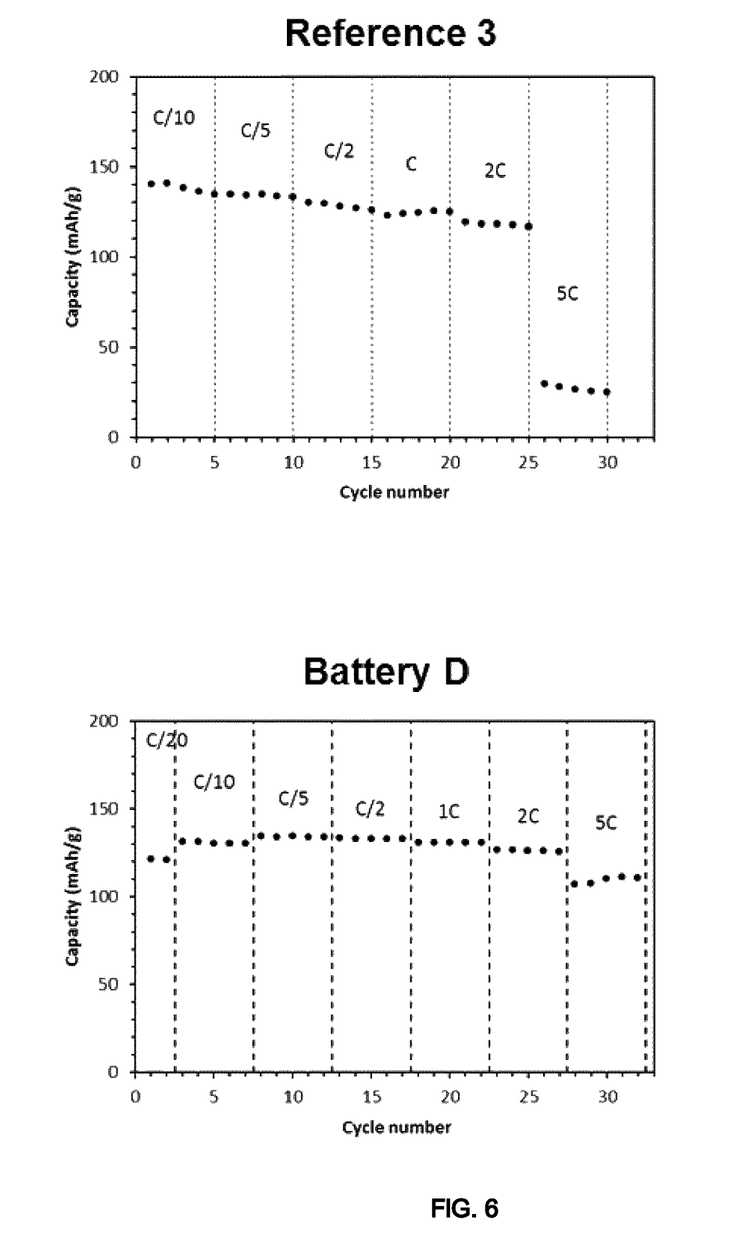
FIG. 6 illustrates graphs showing the results of electrochemical test (capacity vs cycle number with the different discharge rates) of the coin cells of Example 4.

The results show similar performances for the battery according to the invention (Battery D) and the reference battery (Reference 3) at all rates up to 2 C (discharge in 30'), but superior performances of the battery of the present invention at the highest charge rate (5 C) (FIG. 6).

Battery D and Reference 3 battery were subjected to a cycling test in the following conditions:

3× charge/discharge cycle at C/10 rate

97× charge/discharge cycle at 1 C rate with CCCV at 4.2 V for 1 hour or until C/20 current is reached.

This sequence was performed once (i.e. 100 cycles overall).

Figure 7:
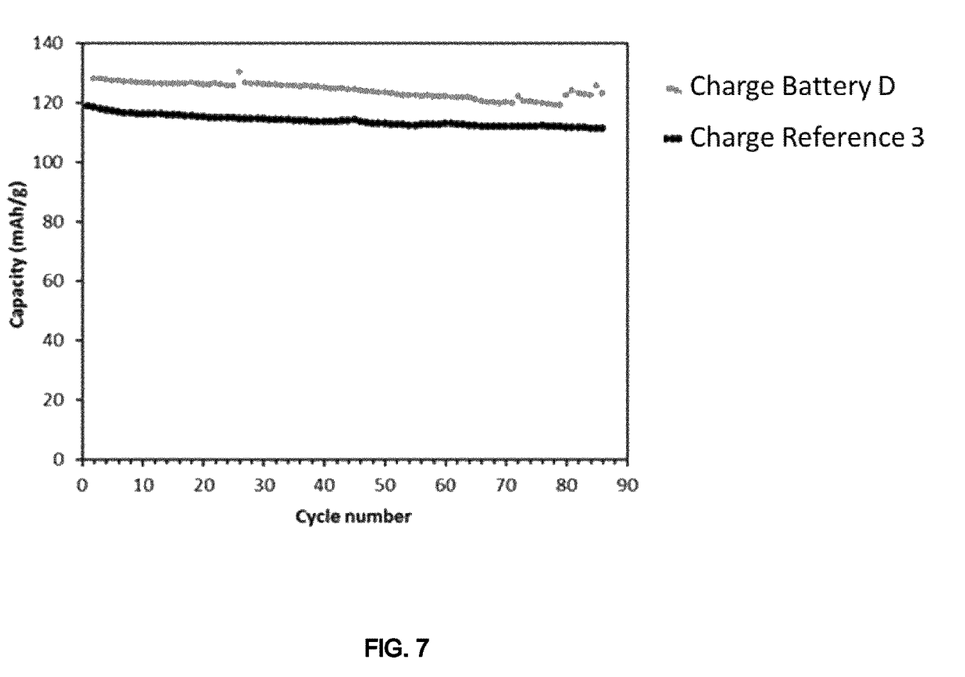
FIG. 7 is a graph showing the results of cycling test (capacity vs cycle number) of the coin cells of Example 4.

The results show similar performances for the battery according to the invention (Battery D) and the reference battery (Reference 3) as measured after 88 charge/discharge cycles, thus demonstrating the formation of a particle network which is stable over time without coarsening or sedimentation effects (FIG. 7).

Example 5

A solid-liquid electrolyte comprising 11.9 wt % of PRECIPITATED SILICA 2 in LP30 with 2.0 wt % VC was prepared (Electrolyte E).

The precipitated silica was dried and added to the liquid electrolyte in an inert atmosphere, so as to avoid traces of water in the final product.

Electrolyte (E) was introduced into a coin cell lithium-ion secondary battery configured as schematized in FIG. 3 (Battery E):

negative electrode: Artificial graphite

Formulation: [SCMG-AR graphite]+[Super-P carbon]+[PVDF 8% Solef® 5130] 90:4:6 (manufactured by Umicore)

Electrode loading: 9.3 mg/cm², 200-202 µm thickness;

positive electrode: LiCoO₂ Cellcore® LCO (manufactured by Umicore)

Formulation: LiCoO₂+[Super-P carbon]+[PVDF 8% Solef®5130], ratio 92:4:4 by weight Electrode loading: 17.3 mg/cm², 175-177 µm thickness Theoretical capacity: 161 mAh/g.

A drop of solid-liquid electrolyte was deposited on the negative electrode and the positive electrode was pressed on top.

A reference coin cell lithium-ion battery having the same configuration as Reference 1 battery (Reference 4). The thickness of the layer of liquid electrolyte in the Reference 4 battery was 25 µm.

Battery E and Reference 4 battery were subjected to power test with the same protocol shown in Example 2 (charge-discharge cycles with increasing discharge rates).

Figure 8:
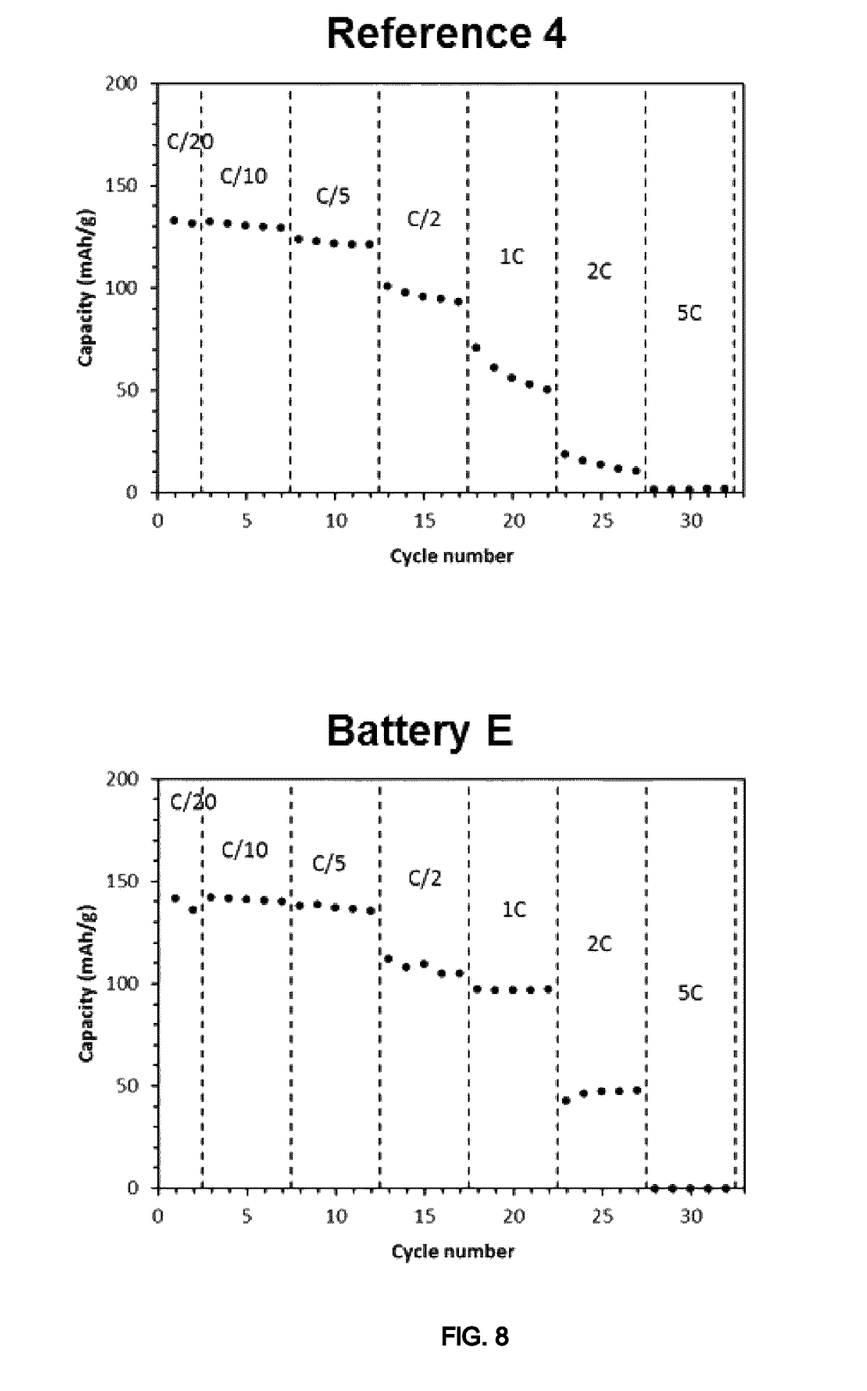
FIG. 8 illustrates graphs showing the results of electrochemical test (capacity vs cycle number with the different discharge rates) of the coin cells of Example 5.

The results show superior performances for the battery according to the invention (Battery E) in comparison with the reference battery (Reference 4) at high charge rates (≥1 C) (FIG. 8).

Battery E and Reference 4 battery were subjected to a cycling test cycling test in the following conditions:

3× charge/discharge cycle at C/10 rate

97× charge/discharge cycle at 1 C rate with CCCV at 4.2 V for 1 hour or until C/20 current is reached.

This sequence was performed four times, (i.e. 400 cycles overall).

Figure 9:
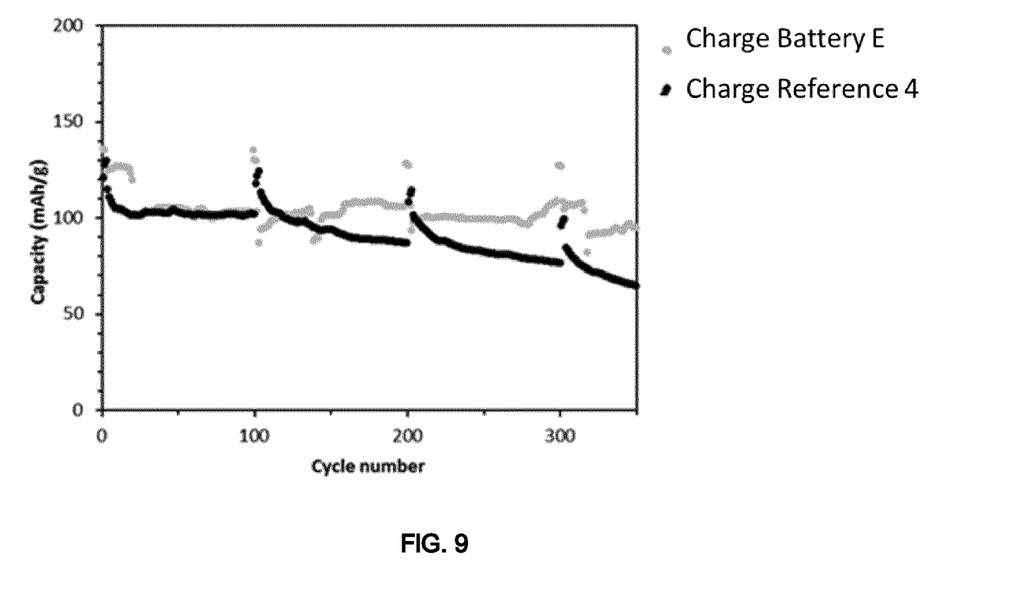
FIG. 9 is a graph showing the results of cycling test (capacity vs cycle number) of the coin cells of Example 5.

The results show similar performances for the battery according to the invention (Battery E) and the reference battery (Reference 4) at least for the first 400 charge/discharge cycles, thus demonstrating the formation of a particle network which is stable over time without coarsening or sedimentation effects also when the electrolyte of the invention is used in a separator-free battery (FIG. 9).

The invention claimed is:

1. A solid-liquid electrolyte in the form of a gel comprising:

at least one ionically conducting salt, at least one organic carbonate-based solvent, and precipitated silica.

2. The solid-liquid electrolyte of claim 1 wherein the precipitated silica is in particulate form.

3. The solid-liquid electrolyte according to claim 1, wherein the precipitated silica has a BET specific surface area of between 100 and 650 m²/g.

4. The solid-liquid electrolyte according to claim 1, wherein the precipitated silica is present in an amount by weight of from 1.0% to 25.0% relative to the total weight of the electrolyte.

5. The solid-liquid electrolyte of claim 4 wherein the silica is present in an amount by weight comprised in the range of from 1.0% to 8.0% relative to the total weight of the electrolyte.

6. The solid-liquid electrolyte of claim 4, wherein the precipitated silica is present in an amount by weight comprised in the range of from 8.0% to 25.0%, relative to the total weight of the electrolyte.

7. The solid-liquid electrolyte of claim 4 wherein the precipitated silica is present in an amount by weight comprised in the range of from 20.0% to 25.0% relative to the total weight of the electrolyte.

8. The solid-liquid electrolyte of claim 5, wherein the precipitated silica has a BET specific surface of from 100 to 270 m²/g.

9. The solid-liquid electrolyte of claim 7, wherein the silica has a BET specific surface of from 300 to 650 m²/g.

10. The solid-liquid electrolyte of claim 1, wherein the precipitated silica has a median particle size from 3.0 to 80.0 µm.

11. The solid-liquid electrolyte of claim 1, wherein the at least one ionically conducting salt is selected from the group consisting of:

(a) MeI, Me(PF₆), Me(BF₄), Me(ClO₄), Me-bis(oxalato) borate, MeCF₃SO₃, Me[N(CF₃SO₂)₂], Me[N(C₂F₅SO₂)₂], Me[N(CF₃SO₂)], wherein R$_F$ is C₂F₅, C₄F₉ or CF₃OCF₂CF₂, Me(AsF₆), Me[C(CF₃SO₂)₃], Me₂S, Me being Li or Na;

(b)

wherein R'$_F$ is selected from the group consisting of F, CF₃, CHF₂, CH₂F, C₂HF₄, C₂H₂F₃, C₂H₃F₂, C₂F₅, C₃F₇, C₃H₂F₅, C₃H₄F₃, C₄F₉, C₄H₂F₇, C₄H₄F₅, C₅F₁₁, C₃F₅OCF₃, C₂F₄OCF₃, C₂H₂F₂OCF₃ and CF₂OCF₃, and (c) mixtures thereof.

12. The solid-liquid electrolyte of claim 1, wherein the at least one ionically conducting salt is selected from the group consisting of LiPF₆, LiBF₄, LiClO₄, lithium bis(oxalato) borate ("LiBOB"), LiN(CF₃SO₂)₂, LiN(C₂F₅SO₂)₂, Li[N(CF₃SO₂)(R$_F$SO₂)]$_n$, with R$_F$ being C₂F₅, C₄F₉, or CF₃OCF₂CF₂, LiAsF₆, LiC(CF₃SO₂)₃ and mixtures thereof.

13. The solid-liquid electrolyte of claim 1, wherein the at least one organic carbonate-based solvent include unsaturated cyclic carbonates and unsaturated acyclic carbonates.

14. The solid-liquid electrolyte of claim 1, wherein the at least one organic carbonate-based solvent is a mixture of at least one unsaturated acyclic carbonate and at least one unsaturated cyclic carbonate.

15. An electronic device comprising the solid-liquid electrolyte according to claim 1.

16. The electronic device according to claim 15 which is a battery.

17. The battery according to claim 16 wherein the solid-liquid electrolyte is applied in the form of a layer between a positive electrode and a negative electrode of the battery.

18. A separator-free secondary battery containing the solid-liquid electrolyte according to claim 6.

19. The solid-liquid electrolyte of claim 13, wherein the at least one organic carbonate-based solvent is selected from the group consisting of ethylene carbonate, propylene carbonate, butylene carbonate, fluoroethylene carbonate, fluoropropylene carbonate, dimethylcarbonate, diethylcarbonate, ethylmethylcarbonate, dimethylethane and mixture thereof.

20. The solid-liquid electrolyte of claim 14, wherein the at least one organic carbonate-based solvent is a mixture of ethylene carbonate and dimethylcarbonate.

* * * * *

UNITED STATES PATENT AND TRADEMARK OFFICE
CERTIFICATE OF CORRECTION

PATENT NO. : 10,916,782 B2
APPLICATION NO. : 16/329358
DATED : February 9, 2021
INVENTOR(S) : Thierry Le Mercier et al.

Page 1 of 1

It is certified that error appears in the above-identified patent and that said Letters Patent is hereby corrected as shown below:

In the Claims

Claim 11, Column 14, Line 38, the formula "$Me[N(CF_3SO_2)]$" should read
-- $Me[N(CF_3SO_2)(R_FSO_2)]$ --.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*